United States Patent
Chen et al.

(10) Patent No.: US 10,097,174 B2
(45) Date of Patent: Oct. 9, 2018

(54) SEMICONDUCTOR DEVICE

(71) Applicant: FUJI ELECTRIC CO., LTD., Kawasaki (JP)

(72) Inventors: Shuangching Chen, Matsumoto (JP); Shogo Ogawa, Matsumoto (JP)

(73) Assignee: FUJI ELECTRONICS CO., LTD., Kawasaki (JP)

( * ) Notice: Subject to any disclaimer, the term of this patent is extended or adjusted under 35 U.S.C. 154(b) by 0 days.

(21) Appl. No.: 15/601,425

(22) Filed: May 22, 2017

(65) Prior Publication Data

US 2018/0019744 A1    Jan. 18, 2018

(30) Foreign Application Priority Data

Jul. 15, 2016    (JP) ................. 2016-140157

(51) Int. Cl.
| | |
|---|---|
| *H03K 17/60* | (2006.01) |
| *H03K 17/14* | (2006.01) |
| *H03K 17/567* | (2006.01) |
| *H03K 17/687* | (2006.01) |

(52) U.S. Cl.
CPC ......... *H03K 17/145* (2013.01); *H03K 17/567* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 6,903,597 B2 * | 6/2005 | Tai | ..................... H03K 17/0828 327/108 |
| 7,652,510 B2 | 1/2010 | Izumi et al. | |
| 8,602,645 B2 | 12/2013 | Miyamoto et al. | |
| 8,729,929 B2 * | 5/2014 | Kawamoto | ............ H02H 9/025 327/108 |
| 2008/0303581 A1 | 12/2008 | Izumi et al. | |
| 2009/0161726 A1 | 6/2009 | Miyamoto et al. | |
| 2011/0304941 A1 * | 12/2011 | Tanimura | ................... H02J 3/14 361/93.9 |
| 2012/0242376 A1 * | 9/2012 | Ose | ..................... H03K 17/0828 327/109 |

FOREIGN PATENT DOCUMENTS

| | | |
|---|---|---|
| JP | 2008-125157 | 5/2008 |
| JP | 2008-305984 | 12/2008 |
| JP | 2009-158540 | 7/2009 |

* cited by examiner

*Primary Examiner* — Long Nguyen

(57) ABSTRACT

A semiconductor device includes a switching element including a control electrode, a first main electrode, and a second main electrode: a gate driver connected between the control electrode and the first main electrode, configured to transmit a gate drive signal for driving the control electrode; a Miller voltage detector detecting a Miller voltage between the control electrode and the first main electrode when the switching element turns off; a current value detector detecting a principal current flowing through the switching element; and a temperature calculator calculating a temperature of the switching element from the detected Miller voltage and principal current.

5 Claims, 6 Drawing Sheets

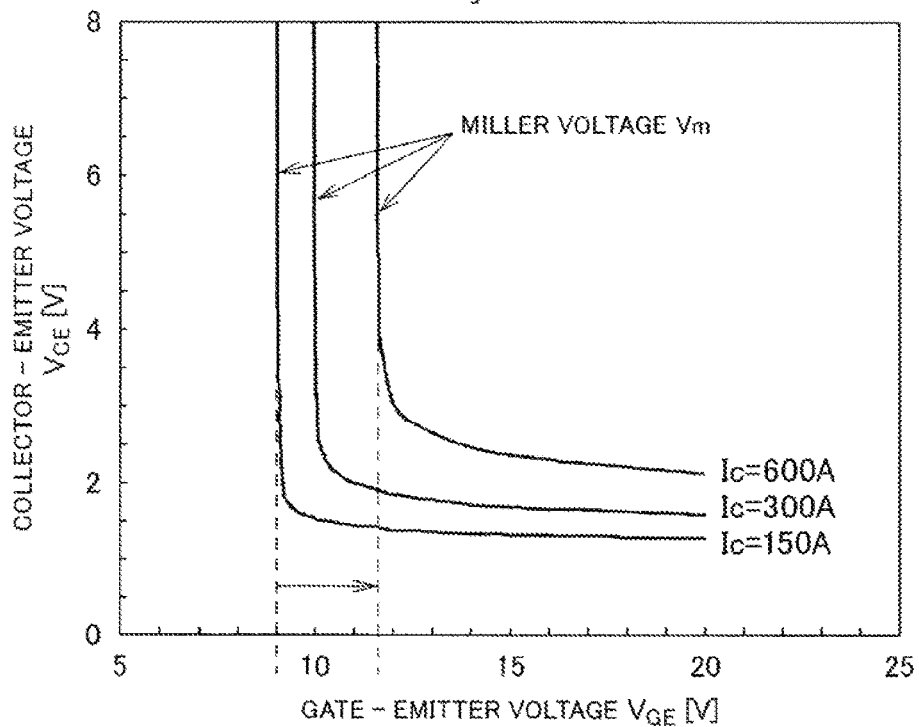
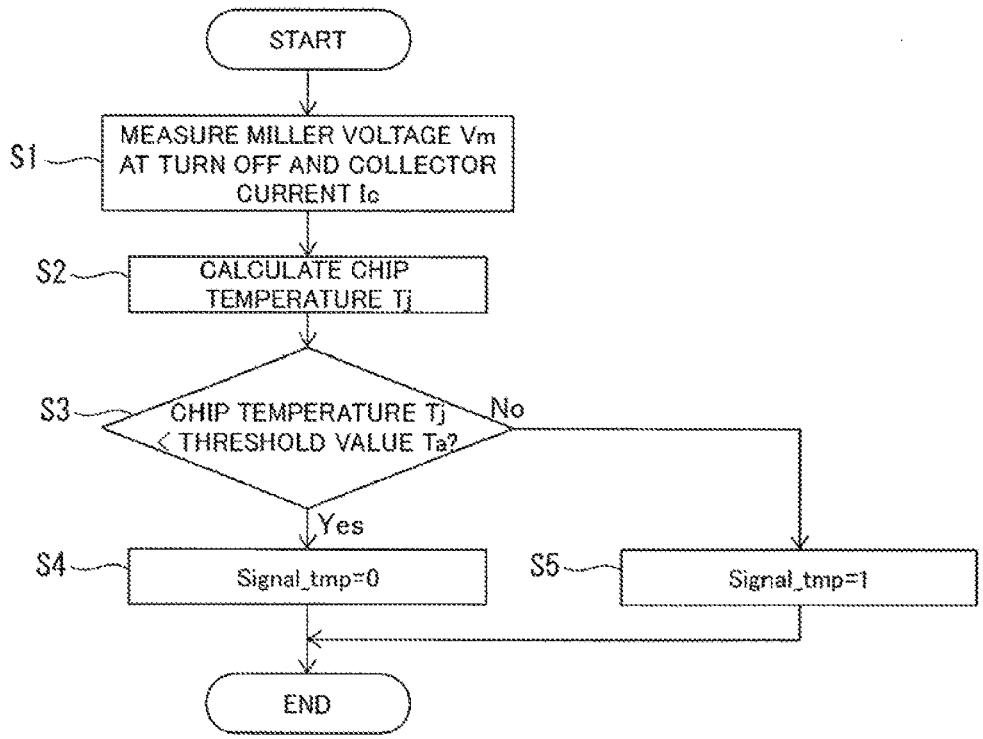

SEMICONDUCTOR DEVICE

CROSS-REFERENCE TO RELATED APPLICATION

This application claims benefit of priority under 35 USC 119 based on Japanese Patent Application No. 2016-140157 filed on Jul. 15, 2016, the entire contents of which are incorporated by reference herein.

BACKGROUND OF THE INVENTION

1. Field of the Invention

The present invention relates to a semiconductor device capable of measuring a chip temperature.

2. Description of the Related Art

As a semiconductor device capable of measuring a chip temperature, a power conversion device in which an element temperature is obtained by measuring a turn-on gate-voltage and an electric current flowing from a switching element to a load when the switching element is switched from an off state to an on state has been proposed (see JP 2008-125157 A). Further, a semiconductor device that detects a first voltage having a certain relation with a voltage applied to an IGBT by feeding a voltage detection signal oscillating at a predetermined frequency to a control electrode, and calculates a temperature of the IGBT on the basis of the detected first voltage has been proposed (see JP 2008-305984 A). A temperature detection system that detects a temperature of a power semiconductor device through a temperature detecting element such as a diode has been proposed (see JP 2009-158540 A).

In the device described in JP 2008-125157 A, the element temperature is obtained on the basis of the turn-on gate-voltage at turn-on transition, but the turn-on gate-voltage at turn-on transition is likely to be unstable, and it is difficult to accurately obtain the element temperature on the basis of the turn-on gate-voltage. In the device described in JP 2008-305984 A, since the temperature of the IGBT is calculated from only the first voltage having a certain relation with the voltage applied to the IGBT, it is difficult to accurately obtain the temperature of the IGBT. In the system described in JP 2009-158540 A, since the temperature detecting element such as a diode is arranged on a semiconductor chip, there is a problem in that a structure and a manufacturing process are complicated, and the number of control terminals of a package is increased. Particularly, it is not possible to be applied to a package in which the number of control terminals is unable to be increased.

SUMMARY OF THE INVENTION

In light of the above problems, it is an object of the present invention to provide a semiconductor device which is capable of measuring a chip temperature accurately with a simple structure without increasing the number of control terminals of a package with no temperature detecting element independently integrated on a semiconductor chip.

An aspect of the present invention inheres in a semiconductor device including: a switching element including a control electrode, a first main electrode, and a second main electrode; a gate driver connected between the control electrode and the first main electrode, configured to transmit a gate drive signal for driving the control electrode; a Miller voltage detector detecting a Miller voltage between the control electrode and the first main electrode when the switching element turns off a current value detector detecting a principal current flowing through the switching element; and a temperature calculator calculating a temperature of the switching element from the detected Miller voltage and principal current.

BRIEF DESCRIPTION OF THE DRAWINGS

FIG. 6 is a graph illustrating a relationship between a gate-emitter voltage and a collector-emitter voltage when a chip temperature is 25° C., and a collector current is changed;

FIG. 7 is a flowchart illustrating an example of a temperature detection method of the semiconductor device pertaining to the embodiment.

DETAILED DESCRIPTION OF THE INVENTION

Figure 1:
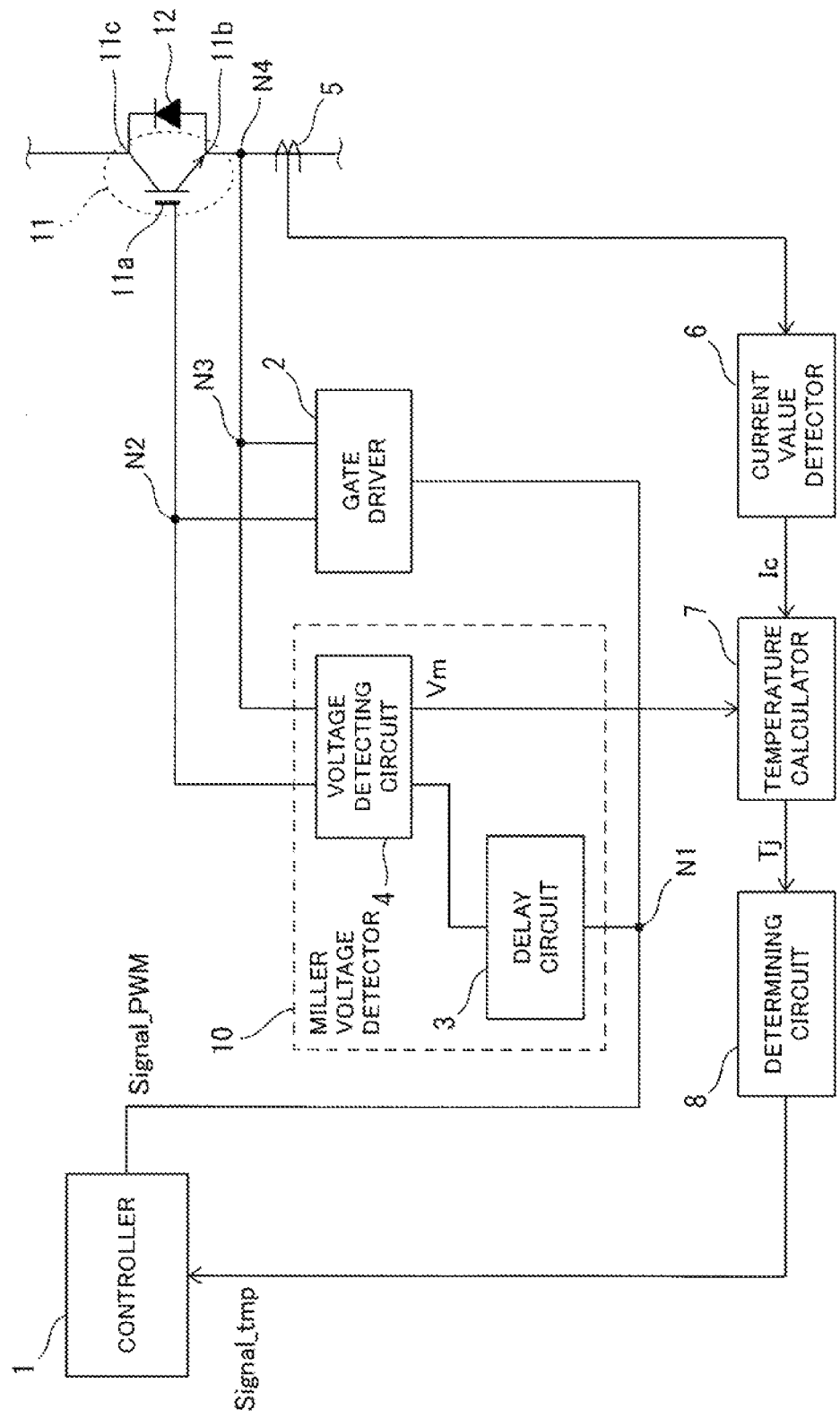
FIG. 1 is a circuit diagram illustrating an example of a semiconductor device according to an embodiment of the present invention.

With reference to the Drawings, an embodiment of the present invention will be described below. In the Specification and the Drawings, the same or similar elements are indicated by the same or similar reference numerals. It should be understood that the Drawings are illustrated schematically, and the relationship between thicknesses and planar dimensions, and proportions of the respective layers are not drawn to scale. The specific thicknesses and dimensions should be considered in accordance with the following explanations. It should also be understood that the respective Drawings are illustrated with the dimensional relationships and proportions different from each other.

In this specification, a "first main electrode" is assigned to a semiconductor region which serves as an emitter region or a collector region in an IGBT. In a MOSFET or a MOSSIT—or alternatively more generalized as a MISFET or a MISSIT—, a "first main electrode" is assigned to a semiconductor region which serves as a main electrode of a source region or a drain region. A "second main electrode"

is assigned to a semiconductor region which serves as an emitter region or a collector region which will not be the first main electrode in the IGBT. In a MOSFET or the like, a "second main electrode" is assigned to a semiconductor region which serves as a source region or a drain region which is will not be the first main electrode. In other words, when the first main electrode is the emitter region, the second main electrode means the collector region. When the first main electrode is the source region, the second main electrode means the drain region.

The embodiment described below merely illustrate schematically semiconductor devices for specifying and giving shapes to the technical idea of the present invention, and the span of the technical idea is not limited to materials, shapes, structures, and relative positions of elements described herein. The technical idea of the present invention is to cover various modifications falling within the scope of the invention as defined by the following appended claims.

(Structure of Semiconductor Device)

As illustrated in FIG. 1, a semiconductor device according to an embodiment of the present invention includes a switching element 11, a gate driver 2 and a controller 1 that controls the gate driver 2. The switching element 11 encompasses a control electrode (gate electrode) 11a, a first main electrode (emitter electrode) 11b, and a second main electrode (collector electrode) 11c. The gate driver 2 is connected between the gate electrode 11a and the emitter electrode 11b of the switching element 11 and drives the gate electrode 11a of the switching element 11. The controller 1 embraces an output terminal connected to an input terminal of the gate driver 2.

The controller 1 generates a control signal Signal_PWM for pulse width modulation (PWM) control and transmits the generated control signal Signal_PWM to the gate driver 2. In response to the control signal Signal_PWM transmitted from the controller 1, the gate driver 2 applies a pulse voltage serving as a gate drive signal to the gate electrode 11a of the switching element 11.

The switching element 11 is, for example, an IGBT implementing a part of a power convertor that drives a three-phase AC motor. A freewheeling diode 12 is connected to the switching element 11. A gate switching voltage of the switching element 11 is, for example, about −15 V or more and about 15 V or less.

Figure 2:
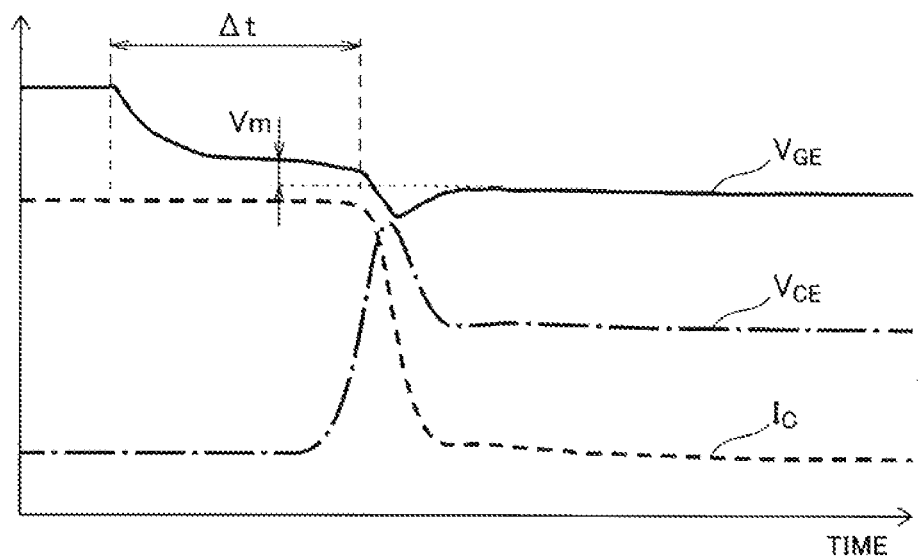
FIG. 2 is a graph illustrating turn-off waveforms of a gate-emitter voltage, a collector-emitter voltage, and a collector current of the semiconductor device pertaining to the embodiment of the present invention.

FIG. 2 illustrates an example of a turn-off waveform of the switching element 11. When the switching element 11 turns off, a gate-collector capacitance changes due to a fluctuation of a collector-emitter voltage $V_{CE}$, and a Miller effect in which the gate-emitter voltage $V_{GE}$ becomes flat occurs in order to discharge the gate-collector capacitance. A length of the Miller period Δt in which the Miller effect occurs depends on a product of a gate-collector capacitance and a gate resistance. In the Specification, the gate-emitter voltage $V_{GE}$ in the Miller period Δt is defined as a "Miller voltage Vm."

As illustrated in FIG. 1, the semiconductor device pertaining to the embodiment of the present invention further includes a Miller voltage detector 10 that detects the Miller voltage Vm between the gate electrode 11a and the emitter electrode 11b of the switching element 11 when the switching element 11 are turned off. Various voltmeters can be used as the Miller voltage detector 10. The Miller voltage detector 10 includes a delay circuit 3 in which an input terminal is connected to a node N1 connecting the output terminal of the controller 1 with the input terminal of the gate driver 2 and a voltage detecting circuit 4 in which a first input terminal is connected to an output terminal of the delay circuit 3. A second input terminal of the voltage detecting circuit 4 is connected to a node N2 connecting the gate electrode 11a of the switching element 11 with the output terminal of the gate driver 2. A third input terminal of the voltage detecting circuit 4 is connected to a node N4 connecting the emitter electrode 11b of the switching element 11 with the output terminal of the gate driver 2.

Figure 3A:
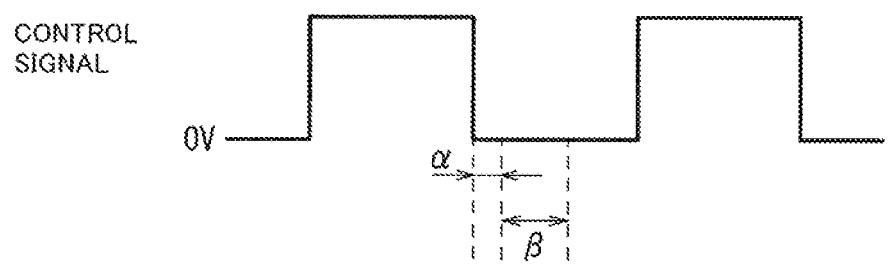
FIG. 3A is a timing chart of a control signal at the time of an operation of the semiconductor device pertaining to the embodiment.
Figure 3B:
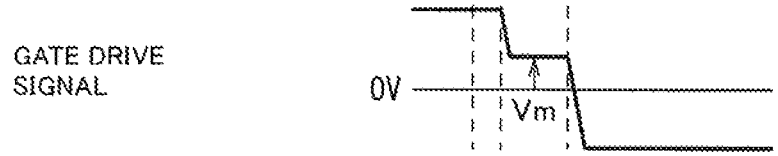
FIG. 3B is a timing chart of a gate drive signal at the time of an operation of the semiconductor device pertaining to the embodiment.

The delay circuit 3 transmits a delay signal obtained by delaying the control signal Signal_PWM transmitted from the controller 1 to the voltage detecting circuit 4. As illustrated in FIG. 3, a delay time α occurs between the control signal Signal_PWM and the gate drive signal. After the delay time α elapses, the gate drive signal falls, and a Miller period β defined by the gate resistance starts. In the Miller period β, the Miller voltage Vm is stabilized in a range of β/2 or more and 5β/6 or less. Therefore, it is desirable that a delay time by the delay circuit 3 that results in a timing to detect the Miller voltage Vm be set to a sum of the delay time α between the control signal Signal_PWM and the gate drive signal, and ½ or more and ⅚ or less of the Miller period β. Therefore, for example, when the Miller voltage Vm is measured at a timing at which ¾ of the Miller period β elapses, a delay time t by the delay circuit 3 can be indicated by the following Eq. (1).

$$T=\alpha+(3\beta/4) \tag{1}$$

The voltage detecting circuit 4 detects the Miller voltage Vm when the switching element 11 turns off at a timing corresponding to the delay signal transmitted from the delay circuit 3. At turn-on transition, the gate voltage becomes unstable due to influence of a reverse recovery current, but the gate voltage at the time of turn-off is more stable than that at turn-on transition, and it is possible to detect the Miller voltage Vm accurately.

A current sensor 5 is arranged in the emitter electrode 11b of the switching element 11. For example, a current transformer (CT) can be used as the current sensor 5. The CT converts a principal current (collector current) Ic flowing between the emitter electrode 11b and the collector electrode 11c of the switching element 11 into a measurement current. An input terminal of a current value detector 6 is connected to the current sensor 5. The current value detector 6 detects a value of the collector current Ic detected by the current sensor 5.

The output terminal of the voltage detecting circuit 4 and the output terminal of the current value detector 6 are connected to first and second input terminals of a temperature calculator 7, respectively. The temperature calculator 7 calculates a temperature (junction temperature) Tj of the switching element 11 as a chip temperature from a value of the Miller voltage Vm detected by the voltage detecting circuit 4 and a value of the collector current Ic detected by the current value detector 6.

Figure 4:
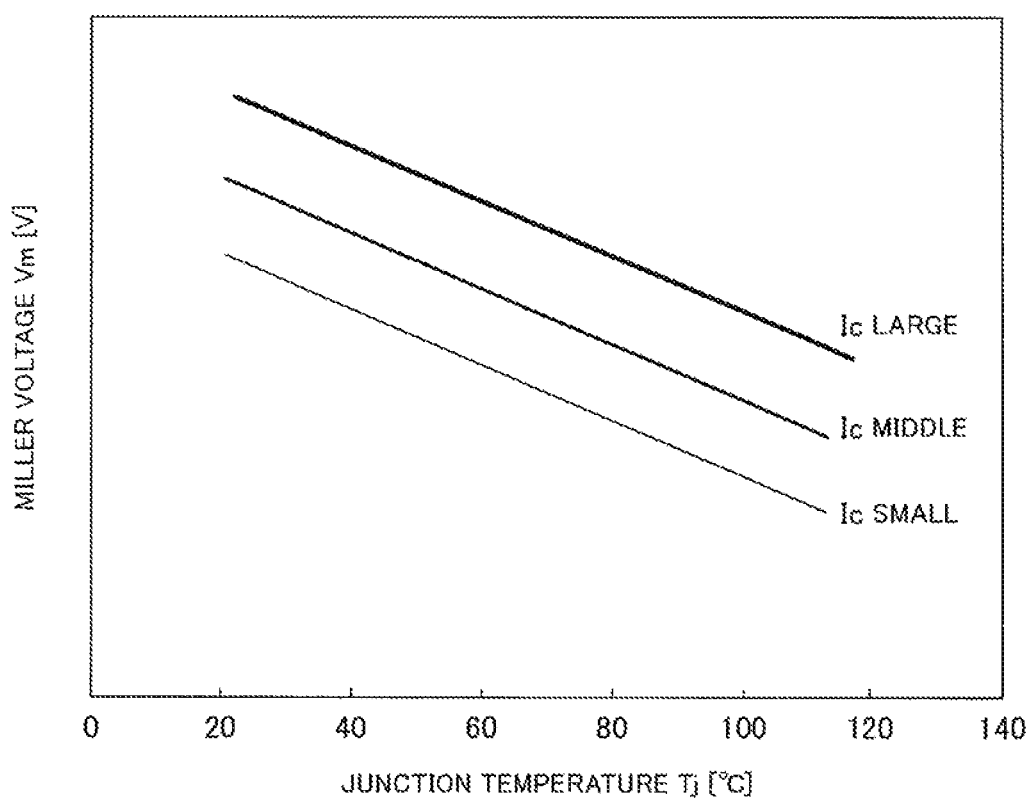
FIG. 4 is a graph illustrating a relationship between a chip temperature and a Miller voltage when a collector current is varied.

Here, a relative relationship among the chip temperature Tj, the Miller voltage Vm, and the collector current Ic will be described. FIG. 4 illustrates a relationship between the chip temperature Tj and the Miller voltage Vm when the collector current Ic is changed with three steps. In FIG. 4, a notation "Ic LARGE" indicates that the collector current Ic is relatively large, a notation of "Ic MIDDLE" indicates that the collector current Ic is relatively second largest, and a notation "Ic SMALL" indicates that the collector current Ic is relatively small. As can be seen from FIG. 4, as the collector current Ic increases, the Miller voltage Vm increases.

Figure 5A:
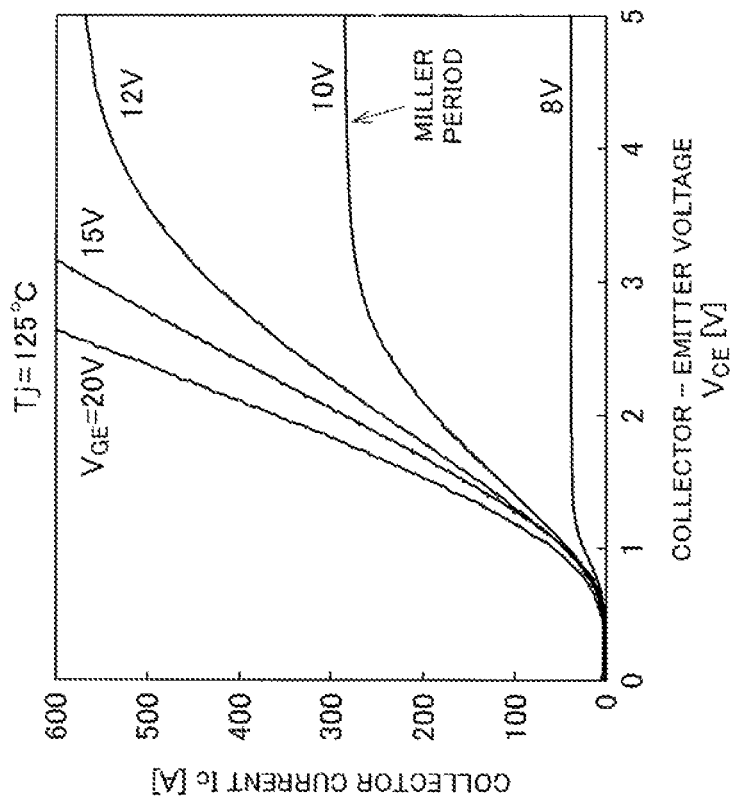
FIG. 5A is a graph illustrating a relationship between a collector-emitter voltage and a collector current when a chip temperature is 25° C., and a gate-emitter voltage is changed.
Figure 5B:
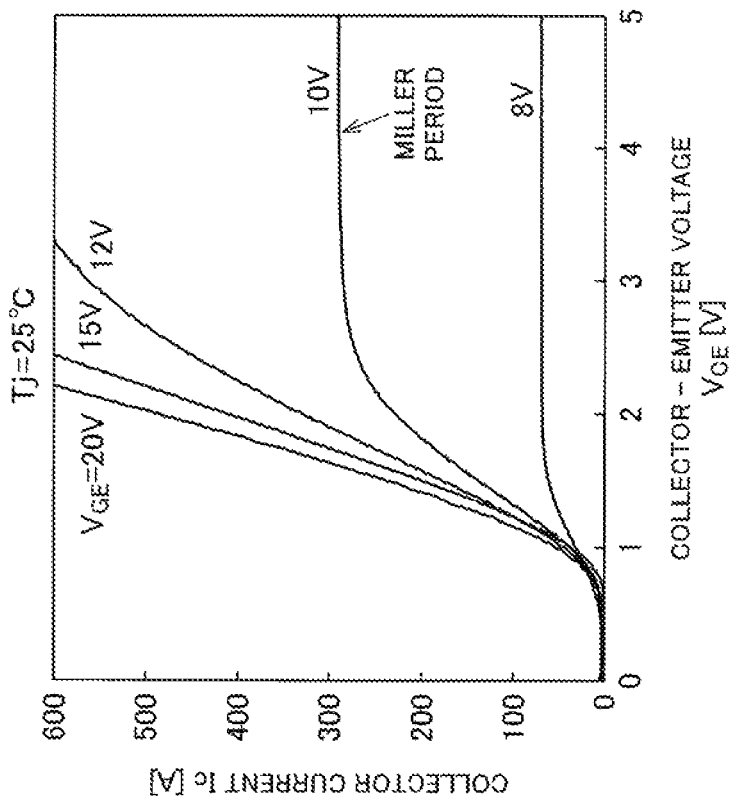
FIG. 5B is a graph illustrating a relationship between a collector-emitter voltage and a collector current when a chip temperature is 125° C., and a gate-emitter voltage is changed.

FIG. 5A illustrates a typical example of a relationship between the collector-emitter voltage $V_{CE}$ and the collector current Ic when the chip temperature Tj is 25° C., and the gate-emitter voltage $V_{GE}$ is changed to 8 V, 10 V, 12 V, 15 V and 20 V. FIG. 5B illustrates a typical example of a relationship between the collector-emitter voltage $V_{CE}$ and the collector current Ic when the chip temperature Tj is 1265° C., and the gate-emitter voltage $V_{GE}$ is changed to 8 V, 10 V, 12 V, 15 V and 20 V. As can be seen from FIGS. 5A and 5B, as the chip temperature Tj increases, the Miller voltage Vm decreases.

FIG. 6 illustrates a relationship between gate-emitter voltage $V_{GE}$ and collector-emitter voltage $V_{CE}$ when the chip temperature Tj is 25° C., and the collector current Ic is changed to 150 A, 300 A and 600 A. As can be seen from FIG. 6, as the collector current Ic increases, the Miller voltage Vm increases.

Accordingly, as the chip temperature Tj increases, the Miller voltage Vm decreases and the collector current Ic increases. On the other hand, as the chip temperature Tj decreases, the Miller voltage Vm increases, and the collector current Ic decreases. As described above, the chip temperature Tj varies depending on the Miller voltage Vm and the collector current Ic. Therefore, the temperature calculator 7 can calculate the chip temperature Tj using a function f (Vm, Ic) of the Miller voltage Vm and the collector current Ic as indicated in the following Eq. (2).

$$Tj=a\times f(Vm,Ic)+b \quad (2)$$

Here, "a" denotes a gradient of a slope, and "b" denotes a constant. Values of a and b and a characteristics of function f (Vm, Ic) can be appropriately prepared from previously measured data.

An output terminal of the temperature calculator 7 is connected to an input terminal of a determining circuit 8. An output terminal of the determining circuit 8 is connected to an input terminal of the controller 1. The determining circuit 8 compares the chip temperature Tj calculated by the temperature calculator 7 with a predetermined temperature Ta, and determines whether or not the chip temperature Tj is lower than the predetermined temperature Ta. The predetermined temperature Ta can be appropriately set depending on a type or a usage environment of switching element 11. When the chip temperature Tj is determined to be lower than the predetermined temperature Ta, the determining circuit 8 transmits signal of "0" as a determination signal Signal_tmp. When the chip temperature Tj is determined to be equal to or higher than the predetermined temperature Ta, the determining circuit 8 transmits signal of "1" as the determination signal Signal_tmp.

When the determination signal Signal_tmp transmitted from the determining circuit 8 is "0," the controller 1 continues to generate the control signal Signal_PWM and continues to drive the switching element 11. On the other hand, when the determination signal Signal_tmp transmitted from the determining circuit 8 is "1," the controller 1 stop the generating of the control signal Signal_PWM and stops the driving of the switching element 11.

(Method of Controlling Semiconductor Device)

Next, with reference to a flowchart of FIG. 7, an example of a control method including a temperature detection method of the semiconductor device pertaining to the embodiment of the present invention will be described.

In step S1, the controller 1 generates the control signal Signal_PWM for PWM control, and transmits the generated control signal Signal_PWM to the gate driver 2. The gate driver 2 drives the gate electrode 11a of the switching element 11 by applying a pulse voltage serving as the gate drive signal to the gate electrode 11a of the switching element 11 in accordance with the control signal Signal_PWM transmitted from the controller 1. The delay circuit 3 transmits the delay signal obtained by delaying the control signal Signal_PWM transmitted from the controller 1 by a predetermined time t. The voltage detecting circuit 4 detects the Miller voltage Vm between the gate electrode 11a and the emitter electrode 11b of the switching element 11 when the switching element are turned off at a timing according to the delay signal transmitted from the delay circuit 3. The current value detector 6 detects a value of the collector current Ic detected by the current sensor 5.

In step S2, the temperature calculator 7 calculates the temperature Tj of the switching element 11 as the chip temperature using the Eq. (2) on the basis of the value of the Miller voltage Vm at the time of turn-off detected by the voltage detecting circuit 4 and the value of the collector current Ic detected by the current value detector 6.

In step S3, the determining circuit 8 determines whether or not the chip temperature Tj calculated by the temperature calculator 7 is lower than a predetermined temperature Ta. When the determining circuit 8 determines that the chip temperature Tj is lower than the predetermined temperature Ta, the process proceeds to step S4. In step S4, the determining circuit 8 transmits signal of "0" as the determination signal Signal_tmp. When the determination signal Signal_tmp transmitted from the determining circuit 8 is "0," the controller 1 continues to generate the control signal Signal_PWM and continues to drive the switching element 11.

On the other hand, when the chip temperature Tj is determined to be equal to or higher than the predetermined temperature Ta in step S3, the process proceeds to step S5. In step S5, the determining circuit 8 transmits signal of "1" as the determination signal Signal_tmp. When the determination signal Signal_tmp transmitted from the determining circuit 8 is "1," the controller 1 stops the generating of the control signal Signal_PWM and stops the driving of the switching element 11.

As described above, according to the semiconductor device pertaining to the embodiment, the temperature Tj of the switching element 11 is calculated as the chip temperature on the basis of the value of the Miller voltage Vm at the time of turn-off and the value of the collector current Ic. Accordingly, it is possible to accurately calculate the temperature of the switching element 11 with a simple structure without increasing the number of control terminals in an existing package.

Other Embodiments

As described above, the present invention has been described using an embodiment, but Description and the Drawings constituting a part of this disclosure should not be interpreted to limit the present invention. It would be obvious to those skilled in the art that various alternative embodiments, examples, and operational techniques can be made from this disclosure.

Figure 8A:
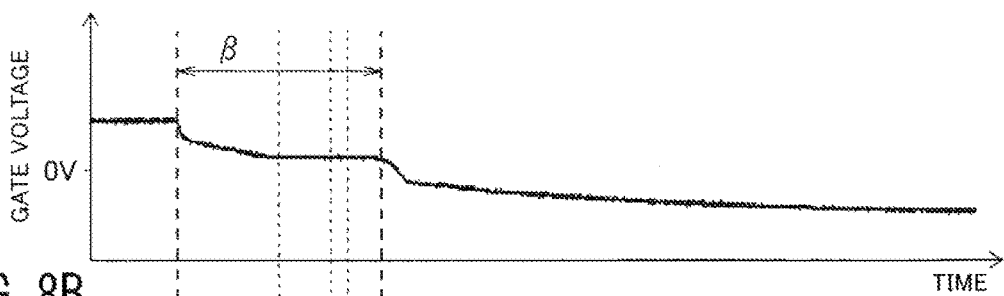
FIG. 8A is a graph illustrating a gate voltage waveform when the semiconductor device pertaining to the embodiment turns off.
Figure 8B:
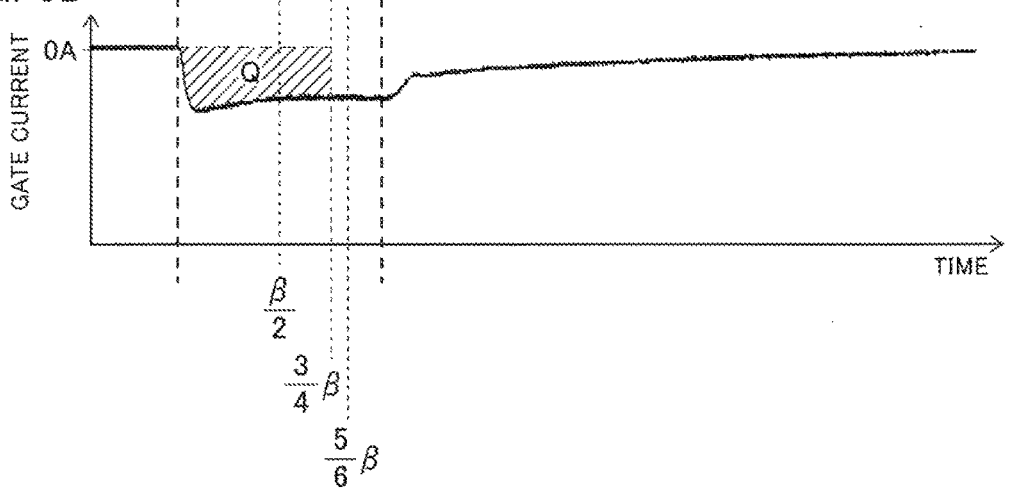
FIG. 8B is a graph illustrating a gate current waveform when the semiconductor device pertaining to the embodiment turns off.

For example, instead of a voltmeter or the like that detects the Miller voltage Vm when the switching element 11 turns off, the voltage detecting circuit 4 may include a current sensor that detects a gate current when the switching element 11 turns off. In this case, the voltage detecting circuit 4 may obtain capacitance from a change in the detected gate current and detect the Miller voltage Vm from the capacitance Q. For example, FIG. 8A and FIG. 8B illustrate a gate voltage waveform and a gate current waveform when the switching element 11 turns off, respectively. As illustrated by a hatched area in FIG. 8B, the Miller voltage Vm can be detected by obtaining the capacitance Q from an integral value of changes in the gate current in the Miller period β.

Further, the example in which the switching element 11 is an IGBT has been described above, but the present invention is not limited to this example. For example, a MOS transistor, an MIS transistor, or the like may be used as the switching element 11. Examples of the MOS transistors include a MOSFET and a MOSSIT. Similarly, examples of the MIS transistors include a MISFET and a MISSIT.

What is claimed is:

1. A semiconductor device, comprising:
 a switching element including a control electrode, a first main electrode, and a second main electrode;
 a gate driver connected between the control electrode and the first main electrode, configured to transmit a gate drive signal for driving the control electrode;
 a Miller voltage detector detecting a Miller voltage between the control electrode and the first main electrode when the switching element turns off;
 a current value detector detecting a principal current flowing through the switching element; and
 a temperature calculator calculating a temperature of the switching element from the detected Miller voltage and principal current.

2. The semiconductor device of claim 1, wherein the Miller voltage detector includes:
 a delay circuit transmitting a delay signal obtained by delaying a control signal for controlling the gate driver; and
 a voltage detecting circuit detecting a value of the Miller voltage at a timing based on the delay signal.

3. The semiconductor device of claim 2, wherein the delay time by the delay circuit is set to a sum of the delay time between the control signal and the gate drive signal, and ½ or more and ⅚ or less of a Miller period defined by a gate resistance of the switching element.

4. The semiconductor device of claim 1, further comprising, a determining circuit determining whether the calculated temperature of the switching element is lower than a predetermined temperature,
 wherein the determining circuit transmits a first determination signal for stopping driving of the switching element when the temperature is determined to be equal to or higher than the predetermined temperature, and
 the determining circuit transmits a second determination signal for continuing to drive the switching element when the temperature is determined to be lower than the predetermined temperature.

5. The semiconductor device of claim 1, wherein the Miller voltage detector detects a change in a gate current when the switching element turns off, obtains a capacitance from an integral value of the change in the gate current, and detects the Miller voltage from the capacitance.

\* \* \* \* \*

UNITED STATES PATENT AND TRADEMARK OFFICE
CERTIFICATE OF CORRECTION

PATENT NO. : 10,097,174 B2  
APPLICATION NO. : 15/601425  
DATED : October 9, 2018  
INVENTOR(S) : Shuangching Chen et al.

Page 1 of 1

It is certified that error appears in the above-identified patent and that said Letters Patent is hereby corrected as shown below:

On the Title Page

Item [73] (Assignee):  
Delete "FUJI ELECTRONICS CO., LTD." and insert -- FUJI ELECTRIC CO., LTD. --, therefore.

Signed and Sealed this  
First Day of January, 2019

Andrei Iancu  
*Director of the United States Patent and Trademark Office*